(12) United States Patent
Kamitani (10) Patent No.: US 6,639,410 B2
(45) Date of Patent: Oct. 28, 2003

(54) INSULATION RESISTANCE MEASURING APPARATUS FOR CAPACITIVE ELECTRONIC PARTS

(75) Inventor: Gaku Kamitani, Shiga (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 10/214,346

(22) Filed: Aug. 8, 2002

(65) Prior Publication Data

US 2002/0196030 A1 Dec. 26, 2002

Related U.S. Application Data

(62) Division of application No. 09/666,843, filed on Sep. 21, 2000, now Pat. No. 6,456,087.

(30) Foreign Application Priority Data

Sep. 22, 1999 (JP) ............................................ 11-268587
Sep. 22, 1999 (JP) ............................................ 11-268588

(51) Int. Cl.$^7$ ........................ G01R 31/08; G01R 31/02
(52) U.S. Cl. ........................ 324/523; 324/540; 324/754
(58) Field of Search ................................. 324/523, 540, 324/754; 360/67; 327/374, 482, 552

(56) References Cited

U.S. PATENT DOCUMENTS

| | | | |
|---|---|---|---|
| 3,624,288 A | * 11/1971 | Hofman | ........................ 348/535 |
| 4,940,982 A | 7/1990 | Gulczynski | |
| 5,321,363 A | 6/1994 | Wakamatsu et al. | |
| 5,530,365 A | 6/1996 | Lefeldt | |
| 5,986,905 A | 11/1999 | Cheng | |
| 6,005,733 A | 12/1999 | Schuelke et al. | |
| 6,031,294 A | 2/2000 | Geis et al. | |
| 6,088,247 A | 7/2000 | Cheng | |
| 6,172,862 B1 | * 1/2001 | Jonnatti et al. | ................ 361/78 |
| 6,262,578 B1 | 7/2001 | Hudson | |

FOREIGN PATENT DOCUMENTS

| | | |
|---|---|---|
| JP | 52-83772 | 12/1950 |
| JP | 5-64782 | 8/1993 |
| JP | 11-44715 | 2/1999 |
| WO | WO 89/02162 | 3/1989 |

OTHER PUBLICATIONS

Chang et al., "Multilayer Ceramic Capacitor Accelerated Life Test System", 35th Electronic Components Conference, Washington, D.C. 1985, pp. 294–297 (IEEE).

Shafranskii et al., "Automatic Checking of the Insulation Resistance of Constant Capacitors", Measurement Techniques, vol. 17, No. 10, Oct. 1974, pp. 1615–1616.

* cited by examiner

*Primary Examiner*—Andrew H. Hirshfeld
*Assistant Examiner*—Wasseem H. Hamdan
(74) *Attorney, Agent, or Firm*—Burns, Doane, Swecker & Mathis, LLP (57) ABSTRACT

Provided is an insulation resistance measuring apparatus capable of highly precisely measuring an insulation resistance characteristic of a capacitive electronic part in a short period of time while being unaffected by various kinds of noises such as from a power supply, measured power supply and the measured capacitor. A predetermined measurement voltage is applied to a capacitive electronic part, and a current flowing through the electronic part is measured in order to calculate an insulation resistance characteristic of the electronic part. A noise clipper circuit having a resistor and a switch connected in parallel with each other is connected on a path leading from a measurement power supply through the capacitive electronic part to a current detector. The switch is controlled to remain closed in an early stage of charging the capacitive electronic part. When charging the capacitive electronic part has progressed sufficiently, the switch is controlled to open.

9 Claims, 8 Drawing Sheets

INSULATION RESISTANCE MEASURING APPARATUS FOR CAPACITIVE ELECTRONIC PARTS

This application is a divisional application of application Ser. No. 09/666,843, filed on Sep. 21, 2000, now U.S. Pat. No. 6,456,087 B1, issued Sep. 24, 2002.

BACKGROUND OF THE INVENTION

1. Field of the Invention

The present invention relates to an apparatus for measuring an insulation resistance characteristic of a capacitive electronic part such as a capacitor.

2. Description of the Related Art

Figure 1:
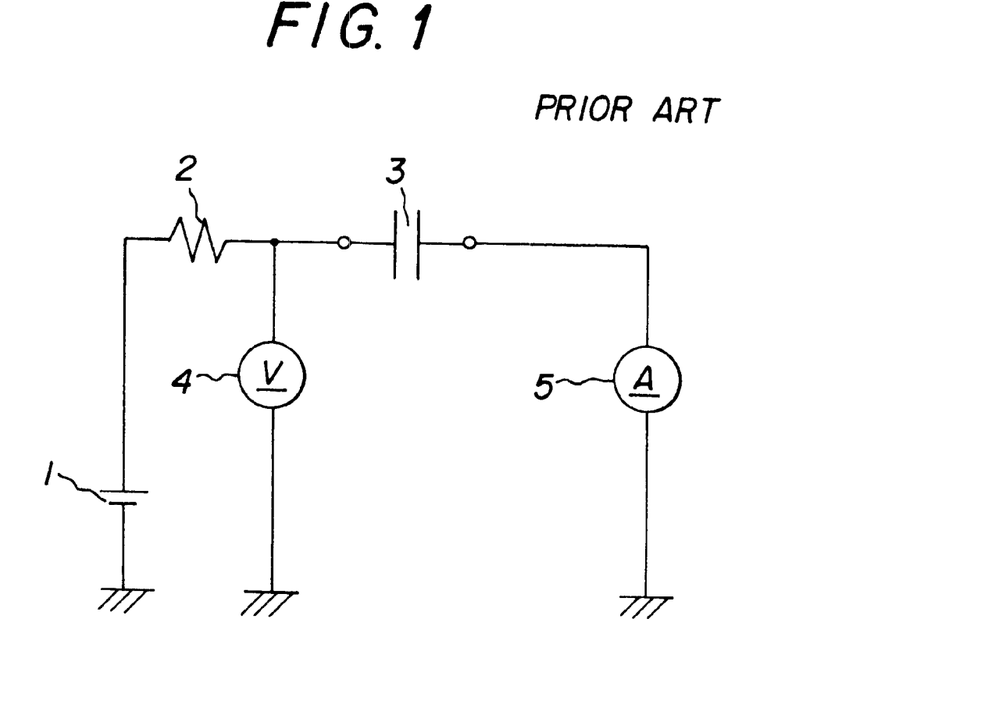
FIG. 1 is a circuit diagram showing an example of a conventional insulation resistance measuring apparatus.

A measuring apparatus shown in FIG. 1 has been used to measure an insulation resistance characteristic of a capacitive electronic part such as a capacitor in the past. Specifically, a direct current (dc) measurement power supply 1 has one terminal thereof grounded and the other terminal thereof connected to one terminal of a measured capacitor 3 via a current-limiting resistor 2. One terminal of a voltmeter 4 is connected between the current-limiting resistor 2 and measured capacitor 3. The other terminal of the measured capacitor 3 is connected to an ammeter 5, and a leakage current flowing through the measured capacitor 3 is measured using the ammeter 5.

A measurement voltage E applied to the measured capacitor 3 is measured using the voltmeter 4, and a current is flowing through the measured capacitor 3 is measured using the ammeter 5. An insulation resistor R characteristic of the measured capacitor 3 can be calculated as follows:

$$R = E/I$$

In the foregoing measuring apparatus, a measured value of the insulation resistance R may contain an error because of a noise caused by the measurement power supply 1, a hum caused by a power supply or the like, and a noise caused by the measured capacitor 3 itself. This poses a problem.

Figure 2:
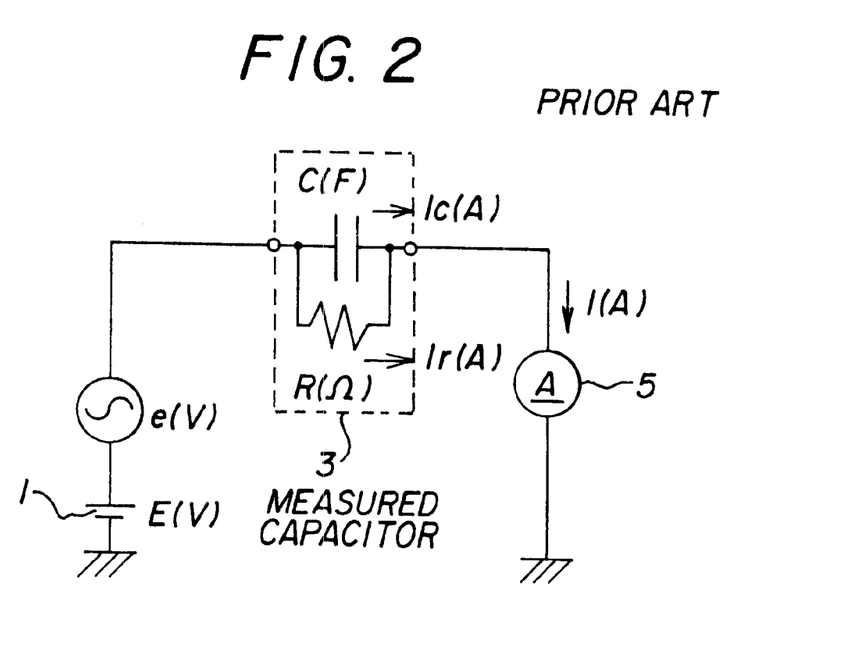
FIG. 2 is an explanatory diagram of noises which occur in series with a measurement power supply.

Reasons why the error occurs will be described with reference to FIG. 2.

Assume that the capacitance of the measured capacitor 3 is C, an insulation resistance is R, a dc voltage generated by the measurement power supply 1 is E, and a voltage (alternating voltage component) derived from a noise caused by the measurement power supply 1 or a hum caused by a mains power supply is e.

Except for the noise component e, I=Ir (leakage current) would be established and the insulation resistance R characteristic of the measured capacitor 3 could be calculated according to R=E/I. However, in reality, the current I does not equal the leakage current Ir determined with the insulation resistance but contains a noise component Ic flowing through the capacitor. Namely, I=Ir+Ic is established. This results in an error of a measured value.

For example, assume that an insulation resistance, characteristic of a capacitor, exhibiting an insulation resistance of 50 MΩ and offering a capacitance of 10 μF, is measured using a voltage of 50 V, and an output of a power supply contains a noise of 10 mVrms. In this case, the leakage current Ir and noise component Ic are calculated as follows:

$$Ir = 50 \text{ V}/50 \text{ M}\Omega = 1 \ \mu\text{A}$$

$$Ic = 10 \text{ mVrms}/(\tfrac{1}{2}\pi \times 60 \times 10 \ \mu\text{F}) = \text{approx. } 38 \ \mu\text{Arms}$$

The current of 1 μA that should be measured is buried under the noise current 38 μA that is 30 or more times larger than the current of 1 μA. This does not allow precise measurement. If the values of the current I detected for a long period of time are integrated, an average of the values of the noise component Ic of the current I approaches 0. Measurement now becomes possible. However, it takes too much time to complete the measurement. This poses a problem.

Figure 3:
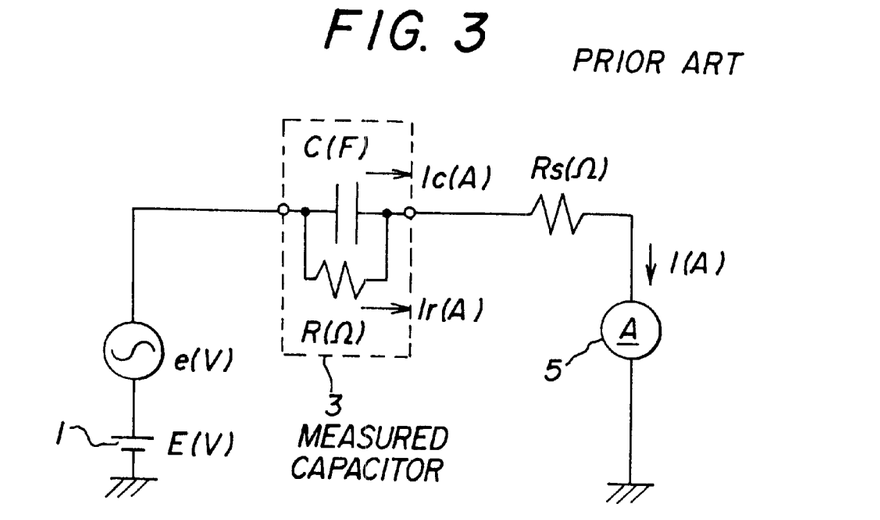
FIG. 3 is a circuit diagram having a noise clipper resistor inserted in the middle of a path leading from a measured capacitor to an ammeter.

When a resistor Rs is, as shown in FIG. 3, inserted in the middle of a path leading from the measured capacitor 3 to the ammeter 5, the noise component Ic can be reduced. For example, assuming that Rs equals 50 kΩ, Ir and Ic are calculated as follows:

$$Ir = 50 \text{ V}/(50 \text{ M}\Omega + 50 \text{ k}\Omega) = \text{approx. } 1 \ \mu\text{A}$$

$$Ic = 10 \text{ mVrms}/(50 \text{ k}\Omega + \tfrac{1}{2}\pi \times 60 \times 10 \ \mu\text{F}) = \text{approx. } 0.2 \ \mu\text{Arms}$$

The noise component is as small as 0.2 μA relative to the current to be measured, 1 μA. This enables precise measurement. However, since the resistor offering a resistance that is as large as 50 kΩ is used, a charging current used to charge the capacitor with the capacitance C flows for a time that is several times longer than a time, constant RC=50 kΩ×10 μF=500 ms. Measurement cannot be started until the charging current ceases. It therefore takes too much time to complete the measurement. This poses a problem.

SUMMARY OF THE INVENTION

An object of the present invention is to provide an insulation resistance measuring apparatus capable of highly precisely measuring an insulation resistance characteristic of a capacitive electronic part in a short period of time while being unaffected by various kinds of noises.

For accomplishing the above object, according to the first embodiment of the present invention, there is provided an insulation resistance measuring apparatus that applies a predetermined measurement voltage to a capacitive electronic part, and measures a current flowing through the electronic part so as to calculate an insulation resistance characteristic of the electronic part. Herein, a noise clipper circuit is connected on a path leading from a measurement power supply through the capacitive electronic part to a current detector. The noise clipper circuit is realized with a circuit having a resistor Ra and a switching means $RE_1$ connected in parallel with each other. The switching means $RE_1$ is controlled to remain closed in an early stage of charging the capacitive electronic part. When charging the capacitive electronic part has progressed sufficiently, the switching means $RE_1$ is controlled to open.

For achieving precise measurement in a short period of time, while a large current is flowing through the noise clipper circuit, or in other words, while a charging current used to charge a capacitor is flowing, a resistance Ra should be reduced. When the current flowing through the noise clipper circuit gets smaller, or in other words, when the charging current used to charge the capacitor ceases and only a current determined with the insulation resistance R flows, the resistance Ra should be increased. According to the first embodiment of the present invention, a noise clipper circuit consists of a resistor Ra and a switching means $RE_1$ which are connected in parallel with each other. In an early stage of charging a capacitive electronic part, the switching means $RE_1$ is closed. When charging the capacitive electronic part has progressed sufficiently, the switching means $RE_1$ is opened.

In the early stage of charging the capacitive electronic part, since the switching means $RE_1$ is closed, the noise clipper circuit offers almost no resistance. In other words the resistance offered by the noise clipper circuit is so small that the capacitive electronic part can be charged smoothly. Thereafter, when charging the capacitive electronic part has been nearly completed, the switching means $RE_1$ is opened. This causes the resistance offered by the noise clipper circuit to increase. A noise component of a charging current is cut off. This results in precise measurement.

For measuring a final insulation resistance characteristic of a capacitive electronic part, the noise clipper circuit composed of the resistor Ra and switching means $RE_1$ alone will suffice. For detecting a temporal variation of the charging current for charging the capacitive electronic part, when the charging current gets smaller with the switching means $RE_1$ closed, the variation of the charging current may not be measured correctly because of the adverse effect of a noise current. However, when charging the capacitive electronic part is performed insufficiently, if the switching means $RE_1$ is opened, charging the capacitive electronic part is retarded because of the resistor Ra.

According to the second embodiment of the present invention, preferably, a noise, clipper circuit is realized with a parallel circuit having a first resistor Ra, a first switching means $RE_1$, and a series circuit connected in parallel with one another. The series circuit consists of a second resistor Rb and a second switching means $RE_2$. In this case, preferably, a resistor offering a resistance smaller than that offered by the first resistor Ra is used as the second resistor Rb.

In an early charging stage, both the switching means $RE_1$ and $RE_2$ are closed. When charging has progressed to some extent and a charging current has been reduced, the switching means $RE_1$ is opened and the switching means $RE_2$ is closed. A resistance offered by the noise clipper circuit corresponds to the sum of the resistances of the resistors Ra and Rb connected in parallel with each other. A noise current is suppressed to be negligible relative to a current detected in this stage. Moreover, since charging the capacitive electron part has progressed, considerably, if charging is somewhat interrupted, no critical situation will take place. However, when charging the capacitive electronic part has further progressed, if the charging current is reduced, the noise current gets relatively larger and becomes outstanding. At this time, when the second switching means $RE_2$ is opened, the resistance offered by the noise clipper circuit corresponds to the resistance of the resistor Ra. The noise current is therefore very small. A leakage current can be measured precisely. Incidentally, the switching means $RE_2$ need not always be closed in the early charging state. The switching means $RE_1$ alone should be closed in the early charging state.

As for the series circuit composed of the second resistor Rb and second switching means $RE_2$ in accordance with the second embodiment of the present invention, any required number of series circuits may be connected in parallel with one another. In this case, while the adverse effect of a noise current is avoided within a wide range of current values, a variation of a charging current can be measured.

A noise clipper circuit in accordance with the present invention may be connected between a measurement power supply and a capacitive electronic part. Preferably, the noise clipper circuit is connected between the capacitive electronic part and a current detector.

Noises with relatively low frequencies fall into those noise voltages which are thought to occur in series with a power supply and those noise voltages which are thought to occur in parallel therewith. The latter noises often occur near a measurement terminal that is brought into contact with the capacitive electronic part. The noises cause a noise current to flow from a point in a noise clipper circuit, at which the noises occur, towards a circuit element offering a lower impedance. When the noise clipper circuit is connected near the power supply rather than the capacitive electronic part, the noise current largely flows into a current detector. This causes an error. Consequently, the noise clipper circuit is connected near the current detector rather than the capacitive electronic part. This causes a noise current stemming from the latter noises to almost entirely flow into the power supply, so that measurement of a current can be achieved while being unaffected by the noise current. For the same reason, preferably, a current-limiting resistor is connected near the current detector rather than the capacitive electronic part.

However, even if the noise clipper circuit is connected near the power supply rather than the capacitive electronic part, the noise clipper circuit works effectively on noises occurring in series with the power supply.

The switching means $RE_1$ and $RE_2$ are closed in the early charging stage. When charging has progressed to some extent, the switching means are opened. For determining the timing of opening, a current value measured by the current detector may be compared with a predetermined threshold value. When the current value measured by the current detector falls below the predetermined threshold value, the switching means may be opened. Alternatively, a time having elapsed since the start of charging may be measured, and the switching means may be opened in a predetermined time after the start of charging.

According to the third embodiment of the present invention, there is provided an insulation resistance measuring apparatus that applies a predetermined measurement voltage to a capacitive electronic part, and measures a current flowing through the electronic part so as to calculate an insulation resistance characteristic of the electronic part. A noise clipper circuit is connected on a path leading from a measurement power supply through the capacitive electronic part to a current detector. The noise clipper circuit is realized with a circuit having a resistor Ra and a diode Da connected in parallel with each other. The anode of the diode Da is connected on the side of the positive voltage terminal of the measurement power supply.

For achieving precise measurement for a short period of time while a large current is, flowing through a noise clipper circuit, that is, while a charging current used to charge a capacitor is flowing, a resistance is reduced. When the current flowing through the noise clipper circuit decreases, that is, when the charging current used to charge the capacitor ceases and only a current determined with an insulation resistance R is present, the resistance is increased. According to the third embodiment of the present invention, the resistor Ra and diode Da connected in parallel with each other are included to constitute a noise clipper circuit, and the anode of the diode Da is directed towards the measurement power supply.

Diodes (semiconductor devices having a pn junction) have the following properties: when a forward voltage is applied, a current hardly flows until the voltage, equals a predetermined voltage (this means that a resistance is large); and when the voltage exceeds the predetermined voltage, a large current flows (this means that the resistance is small). In an early stage of charging a capacitive electronic part or in a stage in which a current is large, the current almost entirely flows through the diode Da. The electronic part can therefore be charged smoothly. In contrast, when charging the capacitive electronic part has been nearly completed, the current flowing through the electronic part becomes very small. No current therefore flows through the diode Da. A current flows exclusively through the resistor Ra. In other words, since the noise clipper circuit offers a large resistance, a noise component of a charging current is cut off. This enables precise measurement.

According the fourth embodiment of the present invention, a noise clipper circuit is a circuit having a resistor Ra, a first diode $Da_1$, and a second diode $Da_2$ connected in parallel with one another. The, first diode $Da_1$ and second diode $Da_2$ share the same properties and are connected in mutually opposite directions.

Specifically, when a noise clipper circuit is realized with a parallel circuit composed only of a resistor and a diode, if a noise voltage is high, a small noise current flows through the diode in the forward direction. However, a current barely flows in the backward direction because of the diode. A circuit for filtering a measured current may be adopted. Otherwise, a current may be measured continuously and the results of measurement may be averaged or processed digitally. In this case, since a noise current flows in the forward direction alone, a measured value of a leakage current becomes larger than a true value.

In reality, when measurement is performed, charging of a capacitor, that is an electronic part, has been nearly completed. A dc voltage applied to a noise clipper circuit is usually 0 V, and a noise voltage e assumes any value near 0 V. Therefore, diodes may be connected in parallel with each other in positive and negative directions. In this case, a noise current flowing in the forward direction and a noise current flowing in the backward direction assume almost the same value. When a measured current is filtered or measured current values are processed digitally, a nearly true leakage current can be determined. Thus, a true insulation resistance can be measured.

According to the fifth embodiment of the present invention, a noise clipper circuit is realized with a circuit having a first resistor Ra, a series circuit composed of a second resistor Rb and a first diode Db, and a second diode Da connected in parallel with one another. The anodes of the first and second diodes Db and Da are connected on the side of the positive voltage terminal of a measurement power supply. A forward voltage drop occurring in the first diode Db is smaller than that occurring in the second diode Da. The resistance of the first resistor Ra is larger than that of the second resistor Rb.

According to the third embodiment of the present invention, when charging a capacitive electronic part has been nearly completed and a current flowing through the electronic part has become very small, no current flows through the diode. The resistance offered by the noise clipper circuit becomes equal to that offered by the resistor Ra. However, in this stage, the electronic part has been charged to develop a voltage which is lowered by a forward voltage than the measurement voltage. The electronic part must therefore be further charged by an amount of charge proportional to the forward voltage through the resistor Ra. This would become an obstacle to more speedy measurement. For shorting the measurement time, a diode causing only a small forward voltage drop should be used. However, a noise voltage is likely to be applied to such a diode causing only a small forward voltage drop.

According to the fifth embodiment of the present invention, the series circuit, composed of the diode Db causing a small forward voltage drop and the resistor Rb, is connected in parallel with the noise clipper circuit described in the third embodiment. A little noise current flowing through the diode Db causing a small forward voltage drop is cut off using the resistor Rb. Consequently, the electronic part is charged more smoothly through the diode Da in the early charging stage. Thereafter, the electronic part is charged through the series circuit composed of the diode Db and resistor Rb. Finally, the resistor Ra is used to perform charging and measurement.

This results in a noise clipper circuit having the optimal properties of not hindering charging of an electronic part during charging and not conducting a noise current during measurement.

According to the sixth embodiment of the present invention, an oppositely-directed zener diode ZDa is substituted for the second diode Da employed according to the fifth aspect. As already known, when a reverse voltage is applied to the zener diode ZDa, a current barely flows through the zener diode ZDa. When the voltage exceeds a predetermined value (breakdown voltage), a large reverse current flows abruptly. Due to the properties of the zener diode, the use of the zener diode ZDa provides the same operation and advantage as those exerted by the noise clipper circuit described in the fifth embodiment.

According to the seventh embodiment of the present invention, a noise clipper circuit consists of a first resistor Ra, a series circuit composed of a second resistor Rb and an opposite parallel circuit having a diode $Db_1$, and a diode $Db_2$ connected in parallel with each other in mutually opposite directions, and an opposite parallel circuit having a diode $Da_1$ and a diode $Da_2$ connected in parallel with each other in mutually opposite directions. The first resistor Ra, series circuit, and opposite parallel circuit are connected in parallel with one another. The diode $Da_1$, diode $Da_2$, diode $Db_1$, and diode $Db_2$ share the same properties. A forward voltage drop occurring in the diode $Db_1$ or $Db_2$ is smaller than that occurring in the diode $Da_1$ or $Da_2$. The resistance of the first resistor Ra is larger than that of the second resistor Rb.

This results in a noise clipper circuit capable of exerting the operations and advantages exerted by the noise clipper circuits described in the fourth and fifth, embodiments.

According to the eighth embodiment of the present invention, an opposite series circuit having a zener diode $ZDa_1$ and a zener diode $ZDa_2$ connected in series with each other in mutually opposite directions is substituted for the opposite parallel circuit composed of the diode $Da_1$ and diode $Da_2$ described in the seventh embodiment. Consequently, the same operation and advantage as those exerted by the noise clipper circuit described in the seventh embodiment can be exerted.

A noise clipper circuit in accordance with the present invention, may be connected between a measurement power supply and a capacitive electronic part. Preferably, the noise clipper circuit is connected between the capacitive electronic part and a current detector.

Noises with relatively low frequencies fall into those noise voltages which are thought to occur in series with a measurement power supply and those noise voltages which are thought to occur in parallel with the measurement power, supply. The latter noises usually occur near a measurement terminal that is brought in contact with an electronic part. The noises cause a large noise current to flow from a point in a noise clipper circuit, at which the noises occur, to a circuit element offering a lower impedance. When the noise clipper circuit is connected near the power supply rather than the capacitive electronic part, a large noise current flows into a current detector. This causes an error. Therefore, the noise clipper circuit is connected near the current detector rather than the electronic part. This causes the noise current stemming from the latter noises to almost entirely flow into the power supply. Measurement of a current will therefore be unaffected by the noise current.

For the same reason, preferably, a current-limiting resistor is connected near the current detector rather than the electronic part.

However, even when the noise clipper circuit is installed near the power supply rather than the electronic part, the noise clipper circuit will prove effective for noises that occur in series with the power supply.

DESCRIPTION OF THE PREFERRED EMBODIMENTS

Figure 4:
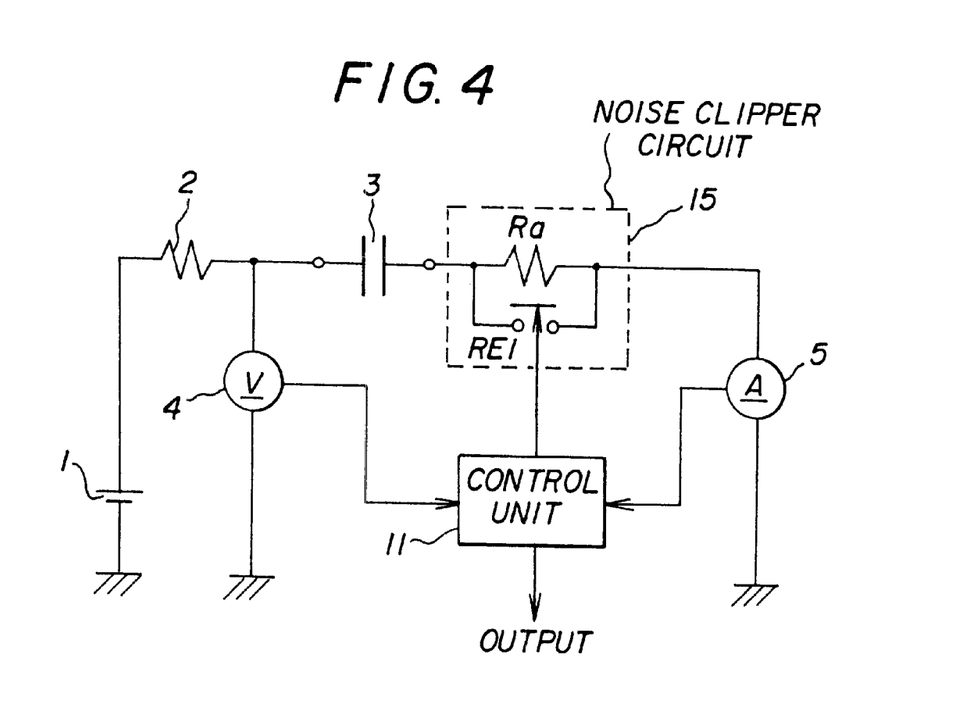
FIG. 4 is a circuit diagram showing an insulation resistance measuring apparatus in accordance with the first embodiment of the present invention.

FIG. 4 shows an insulation resistance measuring apparatus in accordance with the first embodiment of the present invention.

In the drawing, there are shown a direct current (dc) measurement power supply 1, a current-limiting resistor 2, a measured capacitor 3, a voltmeter 4, and an ammeter 5. The same reference numerals are assigned to components identical to those shown in FIG. 1. The iterative description of the components will be omitted.

A noise clipper circuit 15 is connected near the ammeter 5 rather than the measured capacitor 3, or in other words, between the measured capacitor 3 and ammeter 5. According to the present embodiment, the noise clipper circuit 15 consists of a resistor Ra and a switching means $RE_1$ that are connected in parallel with each other. For example, assume that an insulation resistance characteristic of a capacitor exhibiting an insulation resistance of 50 MΩ and offering a capacitance of 10 µF is measured using a measurement power supply that generates a voltage of 50 V. In this case, the resistance of the resistor Ra is preferably set to 50 kΩ or more. The switching means $RE_1$ may be either of a switch with a contact (relay) and a switch without a contact (relay) such as a semiconductor switch (relay).

The switching means $RE_1$ is controlled using a control unit 11. A measurement signal is input from the ammeter 5 to the control unit 11. The control unit 11 compares a current value provided by the ammeter 5 with a predetermined threshold value. In an early stage of charging the measured capacitor 3, the switching means $RE_1$ is controlled to, remain closed. When charging the measured capacitor 3 has progressed sufficiently, or in other words, when the current value provided by the ammeter 5 falls below the predetermined threshold value, the switching means $RE_1$ is controlled to open. A measurement signal is also input from the voltmeter 4 to the control unit 11. The measurement signal is used together with the measurement signal sent from the ammeter 5 to calculate or output an insulation resistance R characteristic of the measured capacitor 3.

Now a description will be made of the actions of the insulation resistance measuring apparatus in accordance with the present embodiment.

In the early stage of charging the measured capacitor 3, the control unit 11 closes the switching means $RE_1$. The noise clipper circuit 15 therefore offers a small resistance. A current flows through the switching means $RE_1$. The capacitor 3 can be charged smoothly. Thereafter, when charging the measured capacitor 3 has been nearly completed, the current flowing through the ammeter 5 gets smaller. The control unit 11 opens the switching means $RE_1$. In other words, the resistance offered by the noise clipper circuit 15 gets larger, and a noise component of a charging current is cut off. This enables precise measurement.

Figure 5:
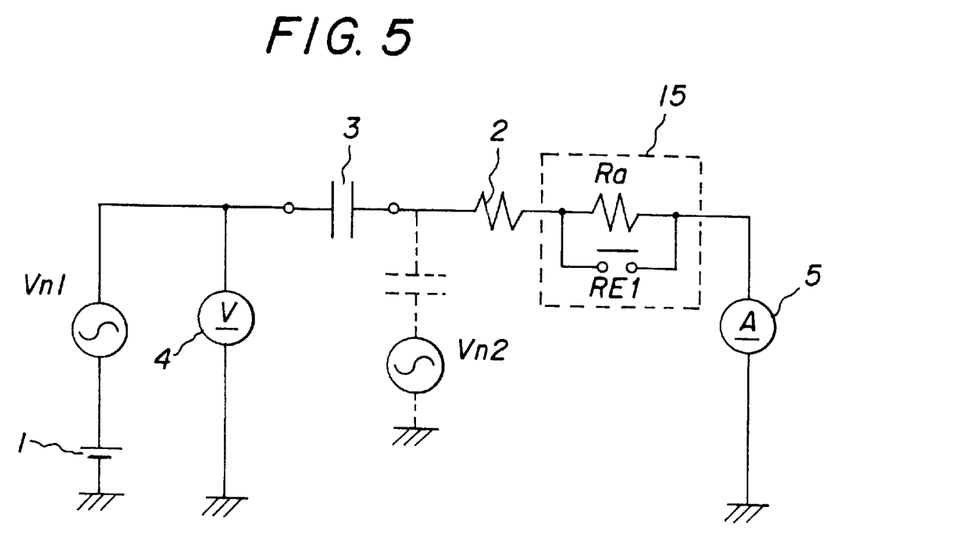
FIG. 5 is a circuit diagram showing an insulation resistance measuring apparatus in accordance with the second embodiment of the present invention.

FIG. 5 shows an insulation resistance measuring apparatus in accordance with the second embodiment of the present invention.

According to the present embodiment, the noise clipper circuit 15 is connected near the ammeter 5 rather than the measured capacitor 3. Moreover, the current-limiting resistor (offering a resistance of, for example, 1 kΩ) 2 is connected near the ammeter 5 rather than the measured capacitor 3.

Noises with relatively low frequencies fall into those noise voltages which occur, like Vn1, in series with the power supply 1 and those noise voltages which occur, like Vn2, in parallel with the power supply 1. The former noises include a noise caused by the power supply, a noise derived from electromagnetic induction, and a noise derived from mechanical vibrations of a capacitor that includes a dielectric exhibiting a high dielectric constant, such as, a ceramic capacitor. The latter noises include a noise derived from electrostatic coupling. The latter noises often occur near a measurement terminal that is brought into contact with the measured capacitor 3. The noises cause a large noise current to flow from a point in a noise clipper circuit, at which the noises occur, towards a circuit element offering a lower impedance. When the noise clipper circuit 15 is connected near the power supply 1 rather than the measured capacitor 3, the large noise current flows into the ammeter 5. This causes an error. Therefore, the noise clipper circuit 15 and current-limiting resistor 2 are connected near the ammeter 5 rather than the measured capacitor 3. This causes the noise current stemming from the latter noises to almost entirely flow into the power supply 1. Consequently, measurement of a current can be achieved while being unaffected by the noise current.

Figure 6:
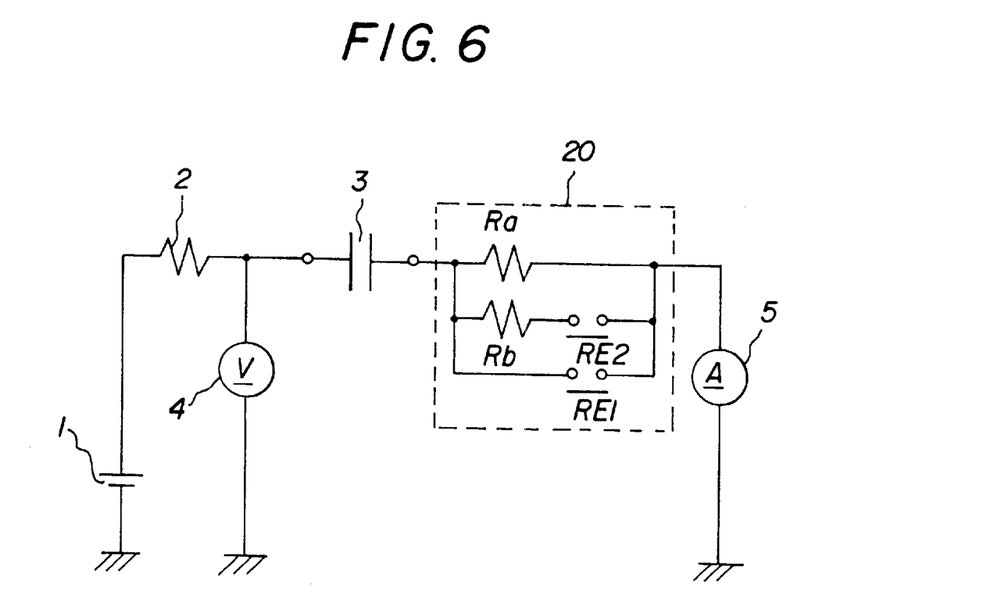
FIG. 6 is a circuit diagram showing an insulation resistance measuring apparatus in accordance with the third embodiment of the present invention.

FIG. 6 shows an insulation resistance measuring apparatus in accordance with the third embodiment of the present invention.

According to the present embodiment, a noise clipper circuit 20 has a series circuit connected in parallel with the resistor Ra and switching means $RE_1$. The series circuit consists of a second resistor Rb and a second switching means $RE_2$. The second resistor Rb offers a resistance smaller than that offered by the first resistor Ra. The resistance of the resistor Rb is, for example, approximately one tenth of that of the resistor Ra.

According to the present embodiment, both the switching means $RE_1$ and $RE_2$ are closed in the early stage of charging the measured capacitor 3. The resistance offered by the noise clipper circuit 20 is so small that a current flows through the switching means $RE_1$. The capacitor 3 can therefore be charged smoothly. Thereafter, when charging the measured capacitor 3 has progressed to some extent, the switching means $RE_1$ alone is opened and the switching means $RE_2$ remains closed. Consequently, the resistance offered by the noise clipper circuit corresponds to the sum of the resistances of the resistors Ra and Rb connected in parallel with each other. A noise current is negligible relative to a current flowing at this time. Moreover, since charging the capacitor 3 has progressed considerably, even if charging is somewhat interrupted, no critical situation takes place. The resistance of the second resistor Rb connected in series with the switching means $RE_2$ is smaller than that of the resistor Ra. The sum of the resistances of the resistors Ra and Rb connected in parallel with each other is too smaller to affect the progress of charging. When charging the measured capacitor 3 has further progressed, the charging current gets smaller. In contrast, the noise current gets relatively larger and becomes outstanding. The second switching means $RE_2$ is then opened. Consequently, the resistance offered by the noise clipper circuit 20 corresponds to the resistance of the resistor Ra. The noise current gets very small, and measurement of a current can be achieved highly precisely.

According to the third embodiment, one series circuit composed of the second resistor Rb and second switching means $RE_2$ is connected in parallel with the noise clipper circuit 20. Alternatively, any required number of series circuits may be connected in parallel with one another. In this case, the resistances of the second resistors Rb included in the plurality of series circuits are differentiated from one another. The second switching means $RE_2$ connected in series with the resistor Rb offering the smallest resistance, is opened first of all the second switching means. The second switching means are thus opened in ascending order of the resistance of the resistor connected in series therewith. Thus, the adverse effect of a noise current can be avoided within a wide range of current values, and a variation of a charging current can be measured.

Figure 7:
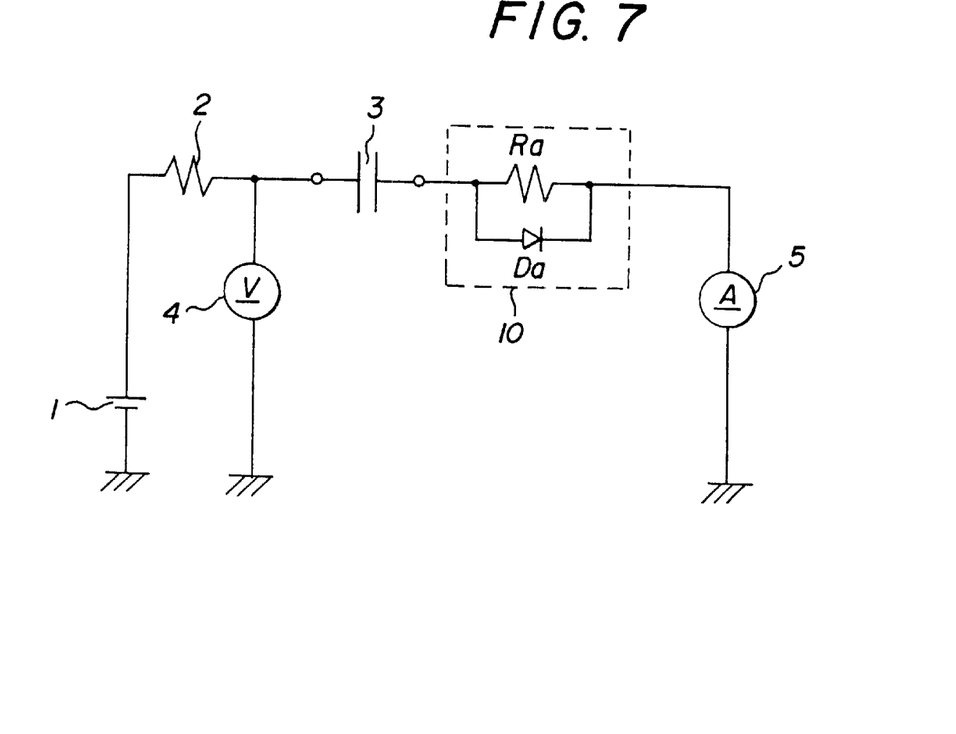
FIG. 7 is a circuit diagram showing an insulation resistance measuring apparatus in accordance with the fourth embodiment of the present invention.

FIG. 7 shows an insulation resistance measuring apparatus in accordance with the fourth embodiment of the present invention.

In the drawing, there are shown a dc measurement power supply 1, a current-limiting resistor 2, a measured capacitor 3, a voltmeter 4, and an ammeter 5.

A noise clipper circuit 10 is connected near the ammeter 5 rather than the measured capacitor 3, or in other words, between the measured capacitor 3 and ammeter 5. The noise clipper circuit 10 consists of a resistor Ra and a diode Da that are connected in parallel with each other. The anode of the diode Da is connected on the side of the positive voltage terminal of the measurement power supply 1. In the present embodiment, an insulation resistance characteristic of the measured capacitance 3 offering a capacitance of 10 $\mu$F is measured via the current-limiting resistor 2 (1 k$\Omega$) using a measurement voltage of 50 V. Moreover, a resistor offering a resistance of 51 k$\Omega$ is adopted as the resistor Ra, and a junction silicon diode is adopted as the diode Da.

Now, a description will be made of the actions of the insulation resistance measuring apparatus of the present embodiment.

When a forward voltage V is applied to the diode Da, almost no current flows until the forward voltage V equals a certain voltage VF. When the forward voltage V exceeds VF, a large current flows through the diode Da. When the relationship of I(A)>VF(V)/Ra(k$\Omega$) is established, the current I almost entirely flows through the diode Da. The measured capacitor 3 is therefore charged smoothly. When the current I ceases, the following relationship is established:

$$I(A) \leq VF(V)/Ra(k\Omega)$$

Consequently, no current flows through the diode Da. A resistance offered by the noise clipper circuit 10 becomes equal to Ra (k$\Omega$). An insulation resistance can be measured highly precisely.

Figure 8:
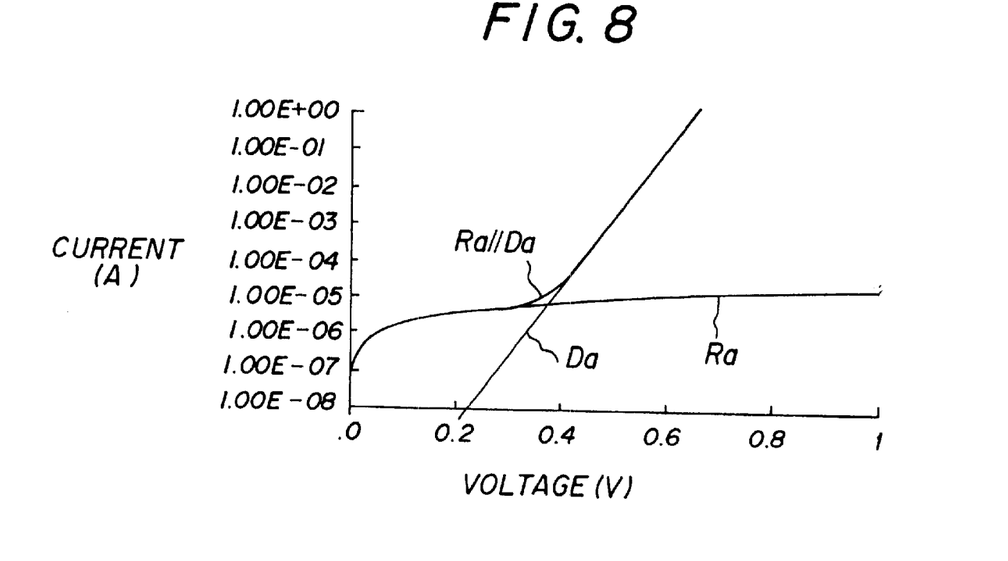
FIG. 8 is a graph indicating current-voltage characteristics exhibited by a noise detections circuit shown in FIG. 7.

The foregoing principles will be detailed in conjunction with FIG. 8. The current-voltage characteristic of the diode Da is, as already known, plotted nearly linearly with voltage values and logarithmic current values indicated with the axes of abscissas and ordinates respectively. The current-voltage characteristic of the resistor Ra and that of the parallel composite circuit composed of the diode Da and resistor Ra are also plotted. Since the diode and resistor are connected in parallel with each other, the current-voltage characteristic of the composite circuit is the mere sum of the current-voltage characteristics of the diode and resistor.

The current-voltage characteristic of the composite circuit demonstrates the points described below. That is to say, when charging the measured capacitor 3 has not progressed, a high voltage is applied to the composite circuit. A large charging current therefore flows. In other words, the circuit offers a small resistance. As charging progresses, the voltage applied to the composite circuit decreases. A current flow gets rapidly smaller. In other words, the circuit offers a large resistance. However, the resistor Ra connected in parallel with the diode prevents the resistance from getting unnecessarily large. The capacitor is charged smoothly during charging, and a required resistance is offered by the circuit during measurement.

Figure 9:
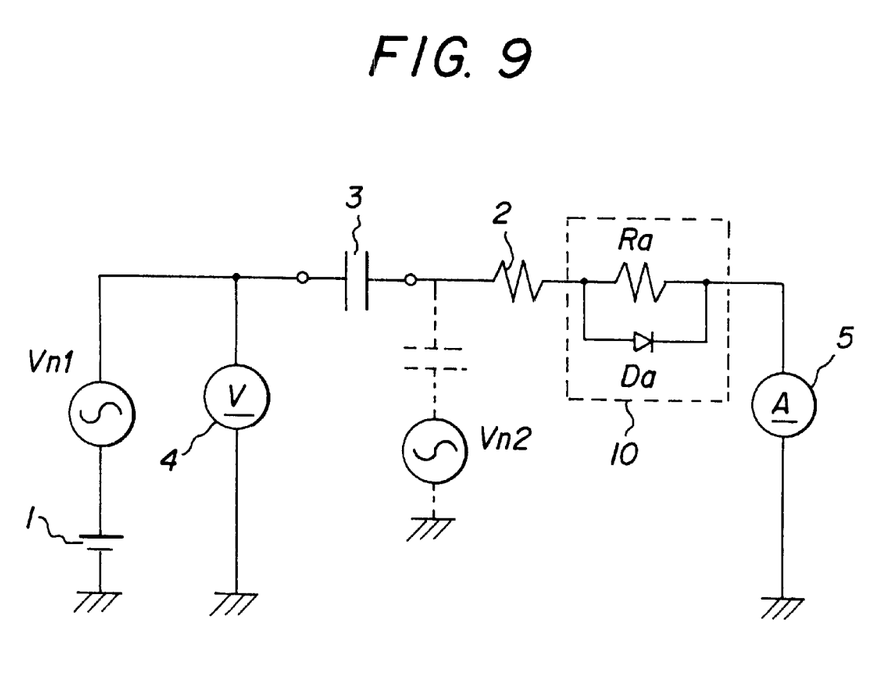
FIG. 9 is a circuit diagram showing an insulation resistance measuring apparatus in accordance with the fifth embodiment of the present invention.

FIG. 9 shows an insulation resistance measuring apparatus in accordance with the fifth embodiment of the present invention.

According to the present embodiment, the noise clipper circuit 10 is connected near the ammeter 5 rather than the measured capacitor 3. The current-limiting resistor 2 is connected near the ammeter 5 rather than the measured capacitor 3.

Noises with relatively low frequencies fall into those noise voltages which occur, like Vn1, in series with the power supply 1 and those noise voltages which occur, like Vn2, in parallel with the power supply 1. The former noises include a noise caused by the power supply, a noise derived from electromagnetic induction, and a noise derived from mechanical vibrations of a capacitor that includes a dielectric exhibiting a high dielectric constant, such as, a ceramic capacitor. The latter noises include a noise derived from electrostatic coupling. The latter noises often occur near a measurement terminal that is brought into contact with the measured capacitor 3. The noises cause a large noise current to flow from a point in the noise clipper circuit, at which the noises occur, to a circuit element offering a lower impedance. When the noise clipper circuit 10 is connected near the power supply 1 rather than the measured capacitor 3, the large noise current flows into the ammeter 5. This causes an error. Therefore the noise clipper circuit 10 and current-limiting resistor 2 are connected near the ammeter 5 rather than the measured capacitor 3. This causes the noise current stemming from the latter noises to nearly entirely flow into the power supply 1. Consequently, measurement of a current is unaffected by the noise current.

The former noises can, needless to say, be clipped as they can in the first embodiment.

Figure 10:
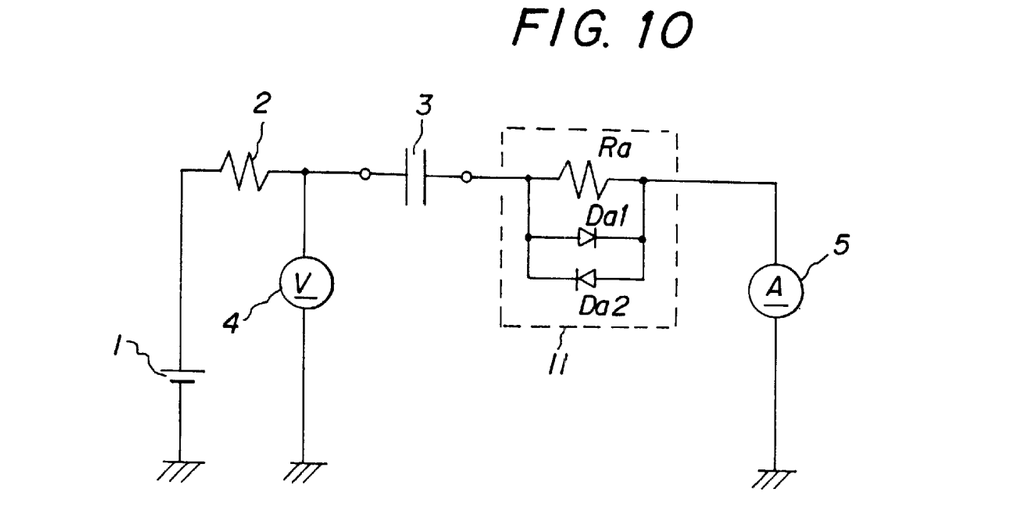
FIG. 10 is a circuit diagram showing an insulation resistance measuring apparatus in accordance with the sixth embodiment of the present invention.

FIG. 10 shows an insulation resistance measuring apparatus in accordance with the sixth embodiment of the present invention.

According to the present embodiment, a noise clipper circuit 11 is realized with a circuit having a resistor Ra, a first diode $Da_1$, and a second diode $Da_2$ connected in parallel with one another. The first diode $Da_1$ and second diode $Da_2$ are connected in mutually opposite directions. The first diode $Da_1$ and second diode $Da_2$ share the same properties.

Figure 11A:
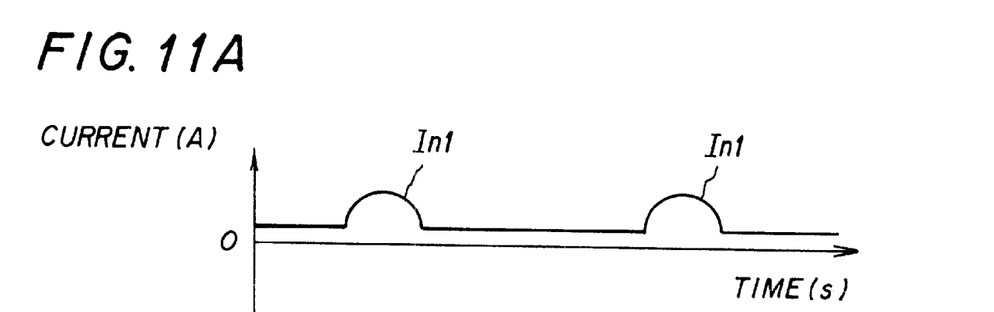
FIG. 11A and FIG. 11B show a temporal variation of a current detected by the insulation resistance measuring apparatus shown in FIG. 10.

According to the fourth and fifth embodiments, when a noise voltage is high, a small noise current flows through the diode Da in the forward direction but hardly any current flows in the backward direction while being blocked by the diode Da. A circuit may be included for filtering a measured current, or a current may be measured continuously and the results of measurement may be averaged or processed digitally. In this case, a noise current $In_1$ flows in the forward direction alone as shown in FIG. 11A. Consequently, a leakage current is measured to have a value larger than a true leakage current value.

Figure 11B:
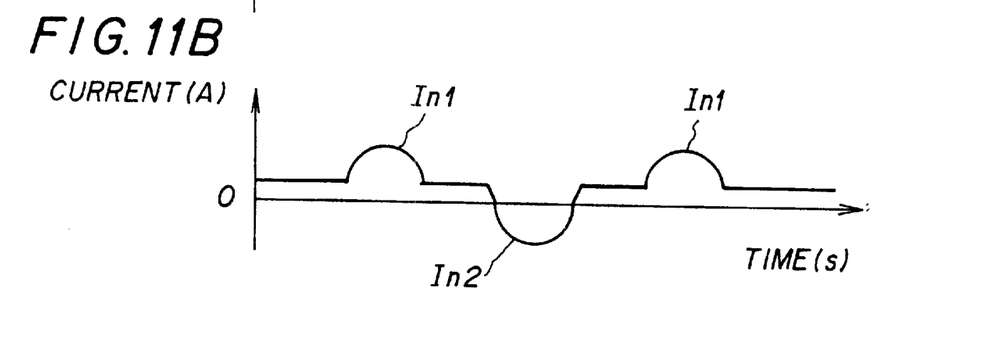

According to the present embodiment, the two diodes $Da_1$ and $Da_2$ are connected in parallel with each other in mutually opposite directions. Thus, a noise current $In_1$ flowing in the forward direction and a noise current $In_2$ flowing in the backward direction assume, as shown in FIG. 11B, almost the same value and are canceled out. When a current being measured is filtered or measured values are averaged or processed digitally, a nearly true leakage current value can be determined. Consequently, a true insulation resistance can be obtained.

Figure 12:
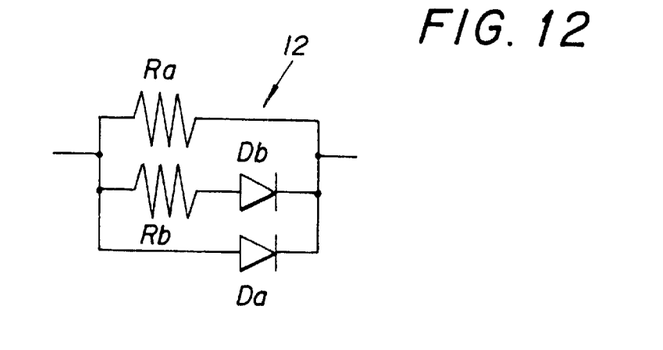
FIG. 12 is a circuit diagram of a noise clipper circuit used in the seventh embodiment of the present invention.

FIG. 12 shows a noise clipper circuit used in the seventh embodiment of the present invention.

A noise clipper circuit 12 used in the present embodiment is a circuit having a first resistor Ra, a series circuit composed of a second resistor Rb and a first diode Db, and a second diode Da connected in parallel with one another. The anodes of the first and second diodes Db and Da are connected on the side of the positive voltage terminal of the measurement power supply 1. A forward voltage drop occurring in the first diode Db is smaller than that occurring in the second diode Da. The resistance of the first resistor Ra is larger than that of the second resistor Rb. Herein, the first resistor Ra is realized with a resistor offering a resistance of 51 kΩ, and the second resistor Rb is realized with a resistor offering a resistance of 5 kΩ. The second diode Da is realized with a Schottky barrier diode, and the first diode Da is realized with a junction silicon diode.

According to the present embodiment, the series circuit composed of the diode Db causing a small forward voltage drop and the resistor Rb is connected in parallel with the noise clipper circuit 10 described in the fourth embodiment. According to the fourth embodiment, the measured capacitor 3 cannot be fully charged through the diode Da by an amount of charge proportional to a certain voltage comparable to a forward voltage drop occurring in the diode Da. For compensating the voltage, the measured capacitor 3 must be charged through the resistor Ra. This time delay is shortened with the inclusion of the series circuit composed of the diode Db and resistor Rb. Moreover, a small noise current flowing through the diode Db causing a small forward voltage drop is cut off using the resistor Rb. Consequently, the measured capacitor 3 is charged smoothly through the diode Da in an early charging stage, and then charged through the series circuit composed of the diode Db and resistor Rb. Finally, the measured capacitor 3 is charged through the resistor Ra, and measurement is then carried out.

Figure 13:
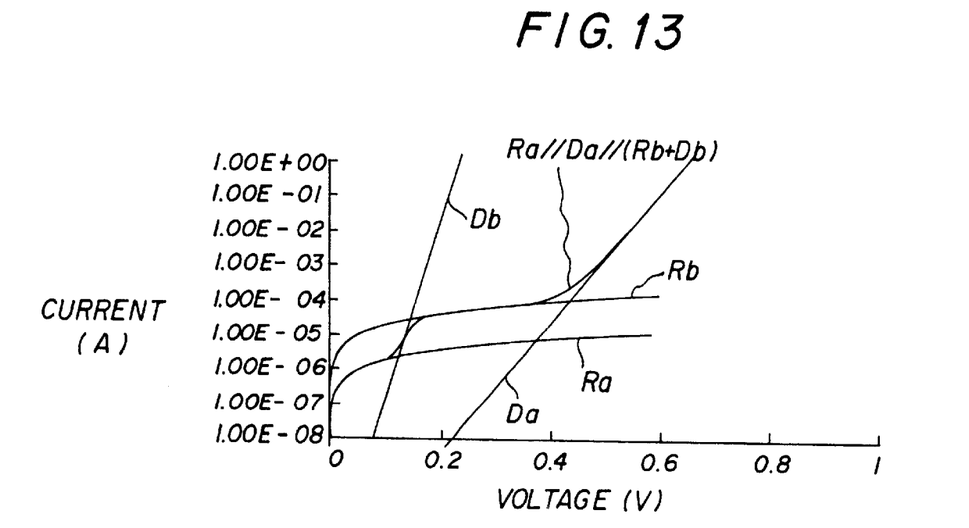
FIG. 13 is a graph indicating current-voltage characteristics exhibited by the noise clipper circuit shown in FIG. 12.

The actions of the noise clipper circuit 12 will be detailed in conjunction with FIG. 13. In addition to the current-voltage characteristics of the resistor Ra, resistor Rb, diode Da, and diode Db, the current-voltage characteristic of the series circuit Rb+Db having, the resistor Rb and diode Db connected in series with each other is graphically shown in FIG. 10. Moreover, the current-voltage characteristic of the noise clipper circuit 12 is indicated with a curve Ra//Da//(Rb+Db). The series circuit Rb+Db is characterized by the doubled opposition to the flow of a curve because of the series connection. In the graph, the axis of abscissas indicates voltage values and the axis of ordinates indicate (logarithmic) current values. The current-voltage characteristic of the series circuit Rb+Db is therefore plotted as a curve tracing the smaller ones of the current values indicated by the characteristic curve Rb and those indicated by the characteristic curve Db. The parallel circuit composed of the resistor Ra, diode Da, and series circuit (Rb+Db) is characterized by the tripled ease, with which a current flows, because of the parallel connection. The current-voltage characteristic of the parallel circuit is therefore plotted as a curve tracing the larger ones of the current values indicated by the characteristic curves Ra, Da, and (Rb+Db). Thus, when a plurality of series circuits each composed of a diode and a resistor and exhibiting various current-voltage characteristics are connected in parallel with one another, a noise clipper circuit exhibiting any current-voltage a characteristic ensues.

This results in the noise clipper circuit 12 having the optimal properties of not hindering charging of the measured capacitor 3 during charging and not conducting a noise current during measurement.

Figure 14:
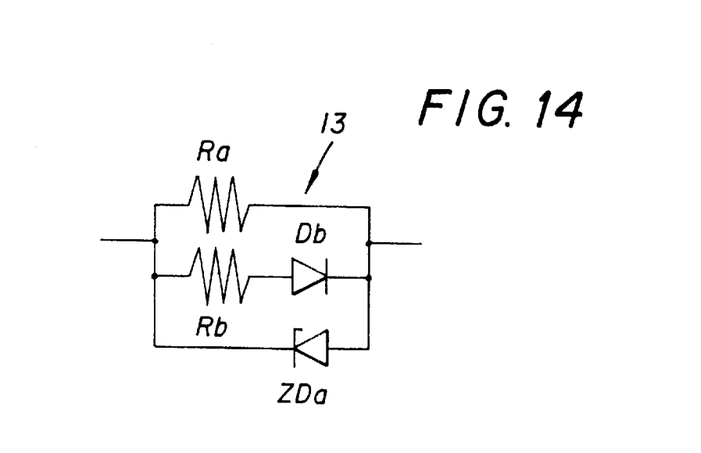
FIG. 14 is a circuit diagram of a noise clipper circuit used in the eighth embodiment of the present invention.

FIG. 14 shows a noise clipper circuit used in the eighth embodiment of the present invention.

A noise clipper circuit 13 used in the present embodiment is different from the noise clipper circuit 12 described in the seventh embodiment in that a zener diode ZDa is substituted for the diode Da. The cathode of the zener diode ZDa is connected on the side of the positive voltage terminal of the measurement power supply 1. A forward voltage drop occurring in the diode Db is set smaller than the breakdown voltage of the zener diode ZDa. The resistance of the resistor Ra is set larger than that of the resistor Rb. The operation and advantage to be exerted are identical to those of the noise clipper circuit 12 described in the seventh embodiment. The description of the operation and advantage will therefore be omitted.

Figure 15:
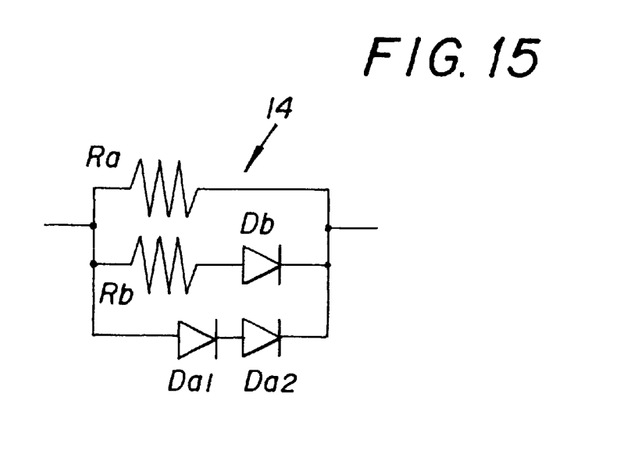
FIG. 15 is a circuit diagram of a noise clipper circuit used in the ninth embodiment of the present invention.

FIG. 15 shows a noise clipper circuit used in the ninth, embodiment of the present invention.

A noise clipper circuit 14 used in the present embodiment is different from the noise clipper circuit 12 described in the seventh embodiment in that a series circuit composed of two or more diodes $Da_1$, $Da_2$, etc. is substituted for the diode Da. Two diodes $Da_1$ and $Da_2$ alone are shown in FIG. 15. Alternatively, three or more diodes may be included. The anodes of all the diodes $Da_1$ and $Da_2$ are connected on the side of the positive voltage terminal of the measurement power supply 1. A forward voltage drop occurring in the diode Db is set smaller than the sum of forward voltage drops occurring in the diodes $Da_1$, $Da_2$, etc. The resistance of the resistor Ra is set larger than that of the resistor Rb. All of the diodes $Da_1$ and $Da_2$ constituting the series circuit may not be mutually identical but may be mutually different.

The operation and advantage to be exerted are identical to those of the noise clipper circuit 12 described in the seventh embodiment. The description of the operation and advantage will therefore be omitted.

Figure 16:
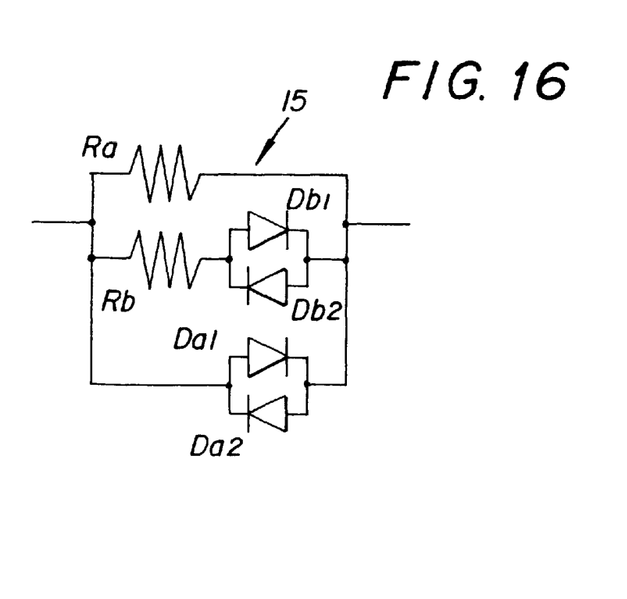
FIG. 16 is a circuit diagram of a noise clipper circuit used in the tenth embodiment of the present invention.

FIG. 16 shows a noise clipper circuit used in the tenth embodiment of the present invention.

A noise clipper circuit 15 used in the present embodiment consists of 1) a first resistor Ra, 2) a circuit having a second resistor Rb and an opposite parallel circuit, which has a diode Db, and a diode $Db_2$ connected in parallel with each other in mutually opposite directions, connected in series with each other, and 3) an opposite parallel circuit having a diode $Da_1$ and a diode $Da_2$ connected in parallel with each other in mutually opposite directions. The first resistor Ra, circuit, and opposite parallel circuit are connected in parallel with one another. The diode $Db_1$, diode $Db_2$, diode $Da_1$, and diode $Da_2$ share the same properties. A forward voltage drop occurring in the diode $Db_1$ or $Db_2$ is smaller than that occurring in the diode $Da_1$ or $Da_2$. The resistance of the resistor Ra is larger than that of the resistor Rb.

The noise clipper circuit 15 can exert both the operations and advantages exerted by the noise clipper circuit 11 described in the sixth embodiment (see FIG. 10) and those exerted by the noise clipper circuit 12 described in the seventh embodiment (see FIG. 12).

Figure 17:
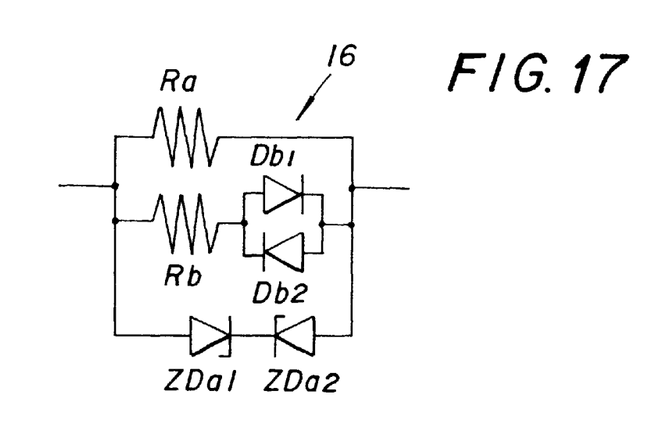
FIG. 17 is a circuit diagram of a noise clipper circuit used in the eleventh embodiment of the present invention.

FIG. 17 shows a noise clipper circuit used in the eleventh embodiment of the present invention.

A noise clipper circuit 16 used in the present embodiment is a variant of the noise clipper circuit 15 described in the tenth embodiment. An opposite series circuit having a zener diode $ZDa_1$ and a zener diode $ZDa_2$ connected in series with each other in mutually opposite directions is substituted for the opposite parallel circuit having the diode $Da_1$ and diode $Da_2$ connected in parallel with each other in mutually opposite directions. The zener diode $ZDa_1$ and zener diode $ZDa_2$ share the same properties. A forward voltage drop occurring in the diode $Db_1$ or $Db_2$ is smaller than the breakdown voltage of the zener diode $ZDa_1$ or $ZDa_2$. Moreover, the resistance of the resistor Ra is larger than that of the resistor Rb.

The noise clipper circuit 16 exerts the same operation and advantage as the noise clipper circuit 15.

Figure 18:
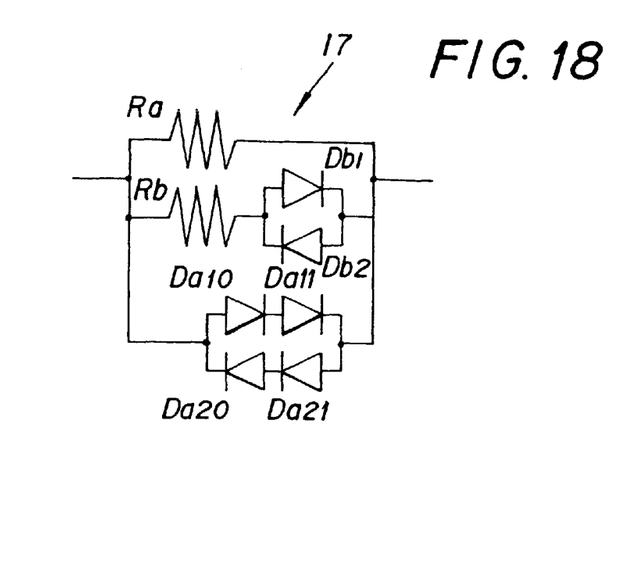
FIG. 18 is a circuit diagram of a noise clipper circuit used in the twelfth embodiment of the present invention.

FIG. 18 shows a noise clipper circuit used in the twelfth embodiment of the present invention.

A noise clipper circuit 17 used in the present embodiment is different from the noise clipper circuit 15 described in the tenth embodiment as described below. That is to say, an opposite parallel circuit having a series circuit composed of a plurality of diodes $Da_{10}$, $Da_{11}$, etc. and a series circuit composed of a plurality of diodes $Da_{20}$, $Da_{21}$, etc. connected in parallel with each other in mutually opposite directions is substituted for the opposite parallel circuit having the diode $Da_1$ and diode $Da_2$ connected in parallel with each other in mutually opposite directions. However, a forward voltage drop occurring in the diodes $Db_1$ or $Db_2$ is smaller than the sum of forward voltage drops occurring in the diodes $Da_{10}$, $Da_{11}$, etc. and the diodes $Da_{20}$, $Da_{21}$, etc. The resistance of the resistor Ra is set larger than that of the resistor Rb. The diodes $Da_{10}$, $Da_{11}$, etc. constituting the series circuit and the diodes $Da_{20}$, $Da_{21}$, etc. constituting the series circuit need not be mutually identical but may be mutually different. The noise clipper circuit 17 exerts the same operation and advantage as the noise clipper circuit 15.

As apparent from the above description, according to the present invention, a noise clipper circuit having a resistor Ra and a switching means $RE_1$ connected in parallel with each other is connected on a path leading from a measurement power supply through a capacitive electronic part to a current detector. The switching means $RE_1$ is closed in an early stage of charging the capacitive electronic part. When charging the capacitive electronic part has progressed sufficiently, the switching means $RE_1$ is opened. Therefore, in the early charging stage, the resistance offered by the noise clipper circuit is so small that the capacitive electronic part can be charged smoothly. When charging has been nearly completed, the switching means $RE_1$ is opened. The resistance offered by the noise clipper circuit gets larger, and a noise component of a charging current is cut off. This enables precise measurement.

Consequently, measurement of an insulation resistance characteristic of a capacitive electronic part can be achieved highly precisely in a short period of time while being unaffected by various kinds of noises.

According to the third aspect of the present invention, a circuit having a resistor Ra and a diode Da connected in parallel with each other is included as a noise clipper circuit. The anode of the diode Da is directed towards a measurement power supply. In an early stage of charging a capacitive electronic part or in a stage in which a current is large, the current almost entirely flows through the diode Da, and the capacitive electronic part is charged smoothly. When charging the capacitive electronic part has been nearly completed, the current flows exclusively through the resistor Ra. A noise component of a charging current is cut off. This enables precise measurement. In other words, measurement of an insulation resistance characteristic of the capacitive electronic part can be achieved highly precisely in a short period of time while being unaffected by various kinds of noises.

According to the fourth aspect of the present invention, a noise clipper circuit is realized with a circuit having a resistor Ra, a first diode $Da_1$, and a second diode $Da_2$ connected in parallel with one another. The first diode $Da_1$ and second diode $Da_2$ share the same properties. The first diode $Da_1$ and second diode $Da_2$ are connected in mutually opposite directions. Consequently, a noise current flowing in the forward direction and a noise current flowing in the backward direction assume nearly the same value. When a current value being measured is filtered or measured current values are processed digitally, a true leakage current value can be determined. Consequently, a true insulation resistance can be obtained.

According to the fifth aspect of the present invention, a noise clipper circuit is realized with a circuit having a first resistor Ra, a series circuit composed of a second resistor Rb and a first diode Db, and a second diode Da connected in parallel with each other. The anodes of the first and second diodes Db and Da are connected on the side of a measurement power supply. A forward voltage drop occurring in the first diode Db is smaller than that occurring in the second diode Da. The resistance of the resistor Ra is larger than that of the resistor Rb. This results in the noise clipper circuit having the optimal properties of not hindering charging of an electronic part during charging and not conducting a noise current during measurement.

According to the sixth aspect of the present invention, an oppositely-directed zener diode ZDa is substituted for the second diode Da described according to the fifth aspect. Consequently, the same operation and advantage as those exerted according to the fifth aspect are exerted.

According to the seventh aspect of the present invention, a noise clipper circuit is realized with a circuit consisting of a first resistor Ra, a series circuit composed of a second resistor Rb and an opposite parallel circuit having a diode $Db_1$ and a diode $Db_2$ connected in parallel with each other in mutually opposite directions, and an opposite parallel circuit having a diode $Da_1$ and a diode $Da_2$ connected in parallel with each other in mutually opposite directions. The first resistor, series circuit, and opposite parallel circuit are connected in parallel with each other. The noise clipper circuit therefore exerts both the operation and advantage exerted by the noise clipper circuit described according to the fourth aspect and those exerted by the noise clipper circuit described according to the fifth aspect.

According to the eighth aspect of the present invention, an opposite series circuit having a zener diode $ZDa_1$ and a zener diode $ZDa_2$ connected in series with each other in mutually opposite directions is substituted for the opposite parallel circuit having the diode $Da_1$ and diode $Da_2$ connected in parallel with each other in mutually opposite directions. This results in a noise clipper circuit capable of exerting both the operation and advantage exerted by the noise clipper circuit described according to the fourth aspect and those exerted by the noise clipper circuit described according to the fifth aspect.

Furthermore, a noise clipper circuit and a current-limiting resistor may be connected near a current detector rather than a capacitive electronic part. This causes, a noise current stemming from noises occurring in parallel with a measurement power supply to nearly entirely flow into the power supply. Measurement of a current is therefore unaffected by the noise current. Thus, an insulation resistance can be measured highly precisely.

The present invention is not limited to the above-described embodiments and can be variously modified within the scope set forth in the appended claims.

What is claimed is:

1. An insulation resistance measuring apparatus for capacitive electronic parts that applies a predetermined measurement voltage to a capacitive electronic part, and measures a current flowing through the electronic part so as to calculate an insulation resistance characteristic of the capacitive electronic part, said insulation resistance measuring apparatus comprising:
    a noise clipper circuit connected in a path leading from a measurement power supply through the capacitive electronic part to a current detector;
    said noise clipper circuit having a parallel circuit including a first resistor, a first switching means, and a series connected in parallel with one another, said series circuit including a second resistor and a second switching means;
    at least said first switching means is controlled to remain closed in an early stage of charging the capacitive electronic part;
    when charging the capacitive electronic part has progressed to some extent, said first switching means is controlled to open and said second switching means is controlled to close; and
    when charging the capacitive electronic part has further progressed, said first and second switching means are controlled to open.

2. An insulation resistance measuring apparatus for capacitive electronic parts that applies a predetermined measurement voltage to a capacitive electronic part, and measures a current flowing through the electronic part so as to calculate an insulation resistance characteristic of the electronic part, said insulation resistance measuring apparatus comprising:
    a noise clipper circuit connected in a path leading from a measurement power supply through the capacitive electronic part to a current detector;
    said noise clipper circuit including a circuit having a resistor and a diode connected in parallel with the resistor; and
    an anode of said diode is connected on a side of a positive voltage terminal of the measurement power supply and a cathode of said diode directly connected to said resistor.

3. An insulation resistance measuring apparatus for capacitive electronic parts that applies a predetermined measurement voltage to a capacitive electronic part, and measures a current flowing through the electronic part so as to calculate an insulation resistance characteristic of the electronic part, said insulation resistance measuring apparatus comprising:
    a noise clipper circuit connected in a path leading from a measurement power supply through the capacitive electronic part to a current detector;
    said noise clipper circuit including a circuit having a resistor, a first diode, and a second diode connected in parallel with one another;
    said first diode and second diode share the same properties; and
    said first diode and second diode are connected a) in mutually opposite directions and b) directly to said current detector.

4. An insulation resistance measuring apparatus for capacitive electronic parts that applies a predetermined measurement voltage to a capacitive electronic part, and measures a current flowing through the electronic part so as to calculate an insulation resistance characteristic of the electronic part, said insulation resistance measuring apparatus comprising:
    a noise clipper circuit connected in a path leading from a measurement power supply through the capacitive electronic part to a current detector;
    said noise clipper circuit including a) a circuit having a first resistor, b) a series circuit having a second resistor and a first diode, and c) a second diode connected in parallel with one another;
    anodes of said first and second diodes are connected on a side of a positive voltage terminal of the measurement power supply;

a forward voltage drop occurring in said first diode is smaller than that occurring in said second diode; and resistance of said first resistor is larger than that of said second resistor.

5. An insulation resistance measuring apparatus for capacitive electronic parts that applies a predetermined measurement voltage to a capacitive electronic part, and measures a current flowing through the electronic part so as to calculate an insulation resistance characteristic of the electronic part, said insulation resistance measuring apparatus comprising:

a noise clipper circuit connected in a path leading from a measurement power supply through the capacitive electronic part to a current detector;

said noise clipper circuit including a) a circuit having a first resistor, b) a series circuit having a second resistor and a diode, and c) a zener diode connected in parallel with one another;

an anode of said diode and a cathode of said zener diode are connected on a side of a positive voltage terminal of the measurement power supply;

a forward voltage drop occurring in said diode is smaller than a breakdown voltage of said zener diode; and resistance of said first resistor is larger than that of said second resistor.

6. An insulation resistance measuring apparatus for capacitive electronic parts that applies a predetermined measurement voltage to a capacitive electronic part, and measures a current flowing through the electronic part so as to calculate an insulation resistance characteristic of the electronic part, said insulation resistance measuring apparatus comprising:

a noise clipper circuit connected in a path leading from a measurement power supply through the capacitive electronic part to a current detector;

said noise clipper circuit includes a) a first resistor, b) a series circuit having a second resistor and a first opposite parallel circuit having diodes connected in parallel with each other in mutually opposite directions, and c) a second opposite parallel circuit having diodes connected in parallel with each other in mutually opposite directions, said first resistor, said series circuit, and said second opposite parallel circuit being connected in parallel with one another;

said diodes constituting said second opposite parallel circuit share the same properties;

said diodes constituting said first opposite parallel circuit share the same properties;

a forward voltage drop occurring in either of said diodes constituting said first opposite parallel circuit is smaller than that occurring in either of said diodes constituting said second opposite parallel circuit; and resistance of said first resistor is larger than that of said second resistor.

7. An insulation resistance measuring apparatus for capacitive electronic parts that applies a predetermined measurement voltage to a capacitive electronic part, and measures a current flowing through the electronic part so as to calculate an insulation resistance characteristic of the electronic part, said insulation resistance measuring apparatus comprising:

a noise clipper circuit connected in a path leading from a measurement power supply through the capacitive electronic part to a current detector;

said noise clipper circuit includes a) a first resistor, b) a series circuit including a second resistor and an opposite parallel circuit having diodes connected in parallel with each other in mutually opposite directions, and c) an opposite series circuit having zener diodes connected in series with each other in mutually opposite directions, said first resistor, said series circuit, and said opposite series circuit being connected in parallel with one another;

said diodes share the same properties;

said zener diodes share the same properties;

a forward voltage drop occurring in either of said diodes is smaller than a breakdown voltage of either of said zener diodes; and resistance of said first resistor is larger than that of said second resistor.

8. An insulation resistance measuring apparatus for capacitive electronic parts according to any of claims 2 to 7, wherein said noise clipper circuit is connected between said capacitive electronic part and current detector.

9. An insulation resistance measuring apparatus for capacitive electronic parts according to claim 8, wherein a current-limiting resistor is connected between said capacitive electronic part and current detector.

* * * * *